(12) United States Patent
Sareen

(10) Patent No.: US 7,656,987 B2
(45) Date of Patent: Feb. 2, 2010

(54) PHASE GENERATOR FOR INTRODUCING PHASE SHIFT IN A SIGNAL

(75) Inventor: Puneet Sareen, Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 558 days.

(21) Appl. No.: 11/324,199

(22) Filed: Dec. 29, 2005

(65) Prior Publication Data

US 2006/0210006 A1 Sep. 21, 2006

(30) Foreign Application Priority Data

Dec. 29, 2004 (IN) .................. 2592/DEL/2004

(51) Int. Cl.
*H04L 7/08* (2006.01)
*H03L 7/08* (2006.01)
*H03H 11/16* (2006.01)

(52) U.S. Cl. .................. 375/376; 375/362; 327/157; 327/160; 327/234

(58) Field of Classification Search .................. 375/327, 375/328, 362, 364, 373, 374, 376; 327/147, 327/148, 151, 156, 157, 160, 163, 231, 233, 327/234–236, 239
See application file for complete search history.

(56) References Cited

U.S. PATENT DOCUMENTS

| | | | |
|---|---|---|---|
| 6,667,641 B1 | 12/2003 | Wang et al. | |
| 6,700,943 B1* | 3/2004 | Miller | 375/354 |
| 2003/0193374 A1* | 10/2003 | McDonald et al. | 331/100 |
| 2003/0201838 A1* | 10/2003 | Tam et al. | 331/74 |

* cited by examiner

*Primary Examiner*—Young T. Tse
(74) *Attorney, Agent, or Firm*—Lisa K. Jorgenson; Robert Iannucci; Seed IP Law Group PLLC

(57) ABSTRACT

A phase generator includes a phase-shift enable and disable signal generator connected to configuration bits at its first input and connected to a reset signal at its reset input for generating a control signal; the configuration bits corresponding to the phase shift desired. The phase generator includes a logic signal generation device connected at its control input to the output of the phase-shift enable and disable signal generator and connected to a reset signal at its reset input for providing a phase generating signal; and a feedback element connected between the output of the logic signal generation device and control input of the phase-shift enable and disable signal generator for providing controlled clock signal to the phase-shift enable and disable signal generator.

24 Claims, 6 Drawing Sheets

PHASE GENERATOR FOR INTRODUCING PHASE SHIFT IN A SIGNAL

BACKGROUND OF THE INVENTION

1. Field of the Invention

The present invention relates to a phase generator for introducing phase shift in a signal.

2. Description of the Related Art

Fundamentally in electronic design, synchronous operation is essential for ensuring that logic operations are being performed correctly. In a system, an integrated circuit may generate its own internal clock based on the master clock signal. Differences in clock signal arrival across the chip, which is called clock-skew, must be avoided. In order to ensure proper operation, it is often important to reduce clock skew for the internal clock of the integrated circuit. Conventionally, more hardware is put into a single chip due to which the complexity on the chip is increasing. It is a fundamental design principle that timing must satisfy register setup hold time requirement. So the clock-skew can potentially cause timing violations or even functional failure of a chip.

Clock skew being a major problem PLL (phase locked loop) is becoming an integral part of the System on Chips (SOCs). In field programmable gate arrays (FPGA) or SOC chips, PLLs are generally employed to provide clock synchronization or to eliminate the clock skew. The other features which PLL supports are the frequency multiplication, programmable duty cycle or programmable phase shift. Programmable phase shift circuit provides an output clock, which has a phase difference with respect to the input clock.

U.S. Pat. No. 6,667,641 provides a programmable phase shift feature for a phase locked loop circuit. The phase shift may be adjusted with equal steps. Each step may be a fixed percentage of the clock period.

FIG. 1 shows a conventional phase generator for a phase locked loop. The outputs of the voltage controlled oscillator (VCO) stage 1620 are mixed together with a multiplexer 1625. The multiplexer is configurable, which is controlled by configuration bits from a configuration register 1633. The output of the multiplexer 1625 is fed back to the phase detector 1610 through a frequency divider 1630. The output clock of the PLL is connected to stage A of the VCO. If the feedback is not mixed from stage A, the output clock will have a phase shift compared with the input clock. The amount of the phase shift is determined by number of stages between A and feedback.

Referring to the FIG. 2, it describes an 8-phase Voltage controlled oscillator. It consists of four differential delay cells 31. 'Ctrl' is the control voltage to each differential delay cell. The outputs of each stage are applied to the inputs of the next stage, but the output 'out' of the forth delay cell is applied to 'in2' of the first input and output 'outbar' of the last delay cell is applied to the input 'in1' of the first delay cell. The eight outputs OT1, OT2, . . . , OT8 are the eight phases each 45-degree apart.

By programming MUX1, a user can adjust the phase difference between the output clock and input clock. This phase difference will be a fixed percentage of the output clock period. It is therefore required that additional phase shift is induced in the output of the PLL besides said fixed percentage of output clock period.

BRIEF SUMMARY OF THE INVENTION

One embodiment of the present invention provides a phase shift generator that induces a phase shift in an input signal. The phase generator induces an additional phase shift in a phase shifted signal.

One embodiment of the present invention provides a phase generator that introduces phase shift in a signal. The phase generator includes:

a phase-shift enable and disable signal generator connected to configuration bits at its first input and connected to a reset signal at its reset input for generating a control signal; said configuration bits corresponding to the phase shift required;

a logic signal generation device connected at its control input to the output of said phase-shift enable and disable signal generator and connected to a reset signal at its reset input for providing a phase generating signal; and a feedback element connected between the output of said logic signal generation device and control input of said phase-shift enable and disable signal generator for providing controlled clock signal to said phase-shift enable and disable signal generator.

BRIEF DESCRIPTION OF THE SEVERAL VIEWS OF THE DRAWING(S)

DETAILED DESCRIPTION OF THE INVENTION

Figure 4:
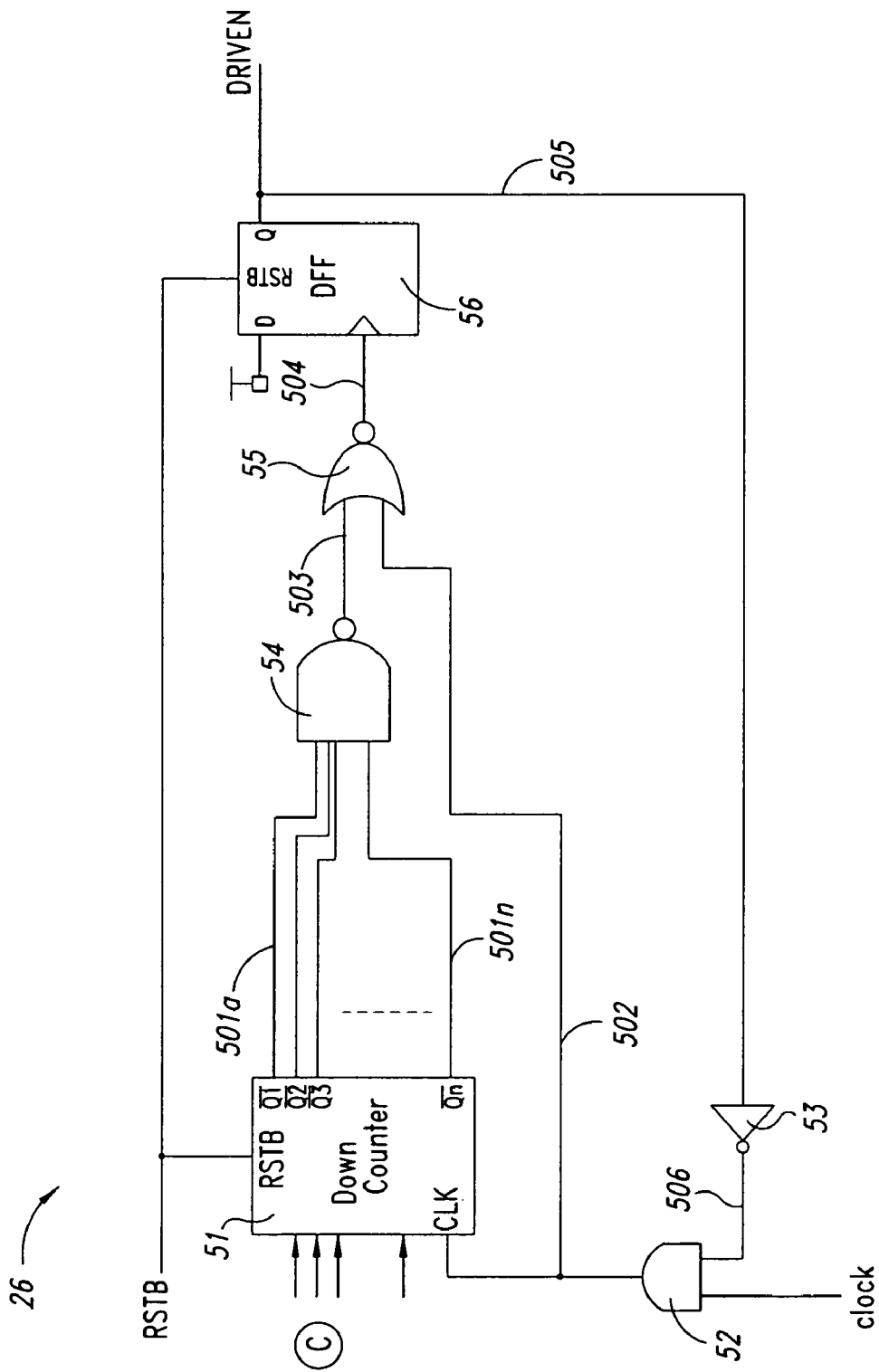
FIG. 4 illustrates a phase generator in accordance with the instant invention.

FIG. 4 describes a phase generator in accordance with one embodiment of the present invention. It contains a programmable down counter 51. The configuration bits to the counter are shown by 'C'. The value of the configuration bits depends on the amount of VCO cycle phase shift desired. It is the binary equivalent of the number of VCO cycles (phase shift desired).

The outputs of the down counter 501a to 501n are connected to a NAND gate 54. The down counter is a simple synchronous down counter. The bits are directly loaded into the flip-flops of the down counter, and the counter starts counting onwards. The outputs 501a to 501n are the 'Qbar' of each FF in the counter. The clock is connected to one terminal of AND gate 52, the other terminal of the AND gate is connected to the output of D flip-flop 56 through inverter 53. The output 502 of the AND gate 52 is connected to clock of the counter 51 and the input of NOR gate 55. The output 504 of the NOR gate 55 is connected to the clock input of the DFF 56. The data flip-flop 56 has a data input connected to a higher voltage supply.

The operation of this block is that, while the whole block is reset, the down counter is loaded with the configuration bits 'C'. Initially the output 505 of the DFF 56 is 0. So the clock directly passes from the AND gate 52 to down counter 51. At the first rising edge of the clock, the down counter starts counting down from the binary value 'C'. The outputs 501a to 501n are initially invert of loaded value 'C' (inverted outputs). So as the counter reaches to zero from the initial count value, all outputs 501a to 501n reach 1, the output 503 of the NAND gate 54 is 0, at the falling edge of the output signal 502, output 504 of the NOR gate 55 is 1, and the output 505 of the DFF '56' is 1. This disables the clock from the NAND gate 52 from reaching the counter 51. This 505 goes to the RSTB of the output divider 27 in FIG. 6, which enables the divider and at next rising edge it starts dividing.

Figure 5:
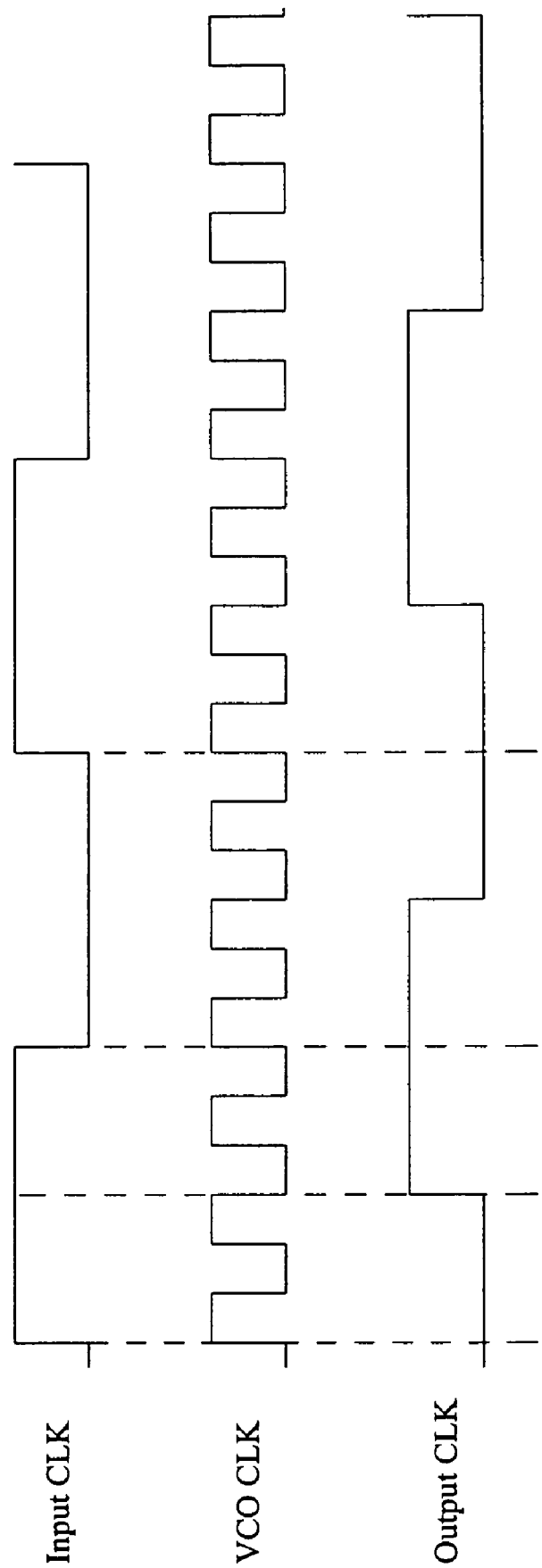
FIG. 5 illustrates the input and output waveforms of the phase generator of FIG. 4.

From FIG. 5, let us assume that the input clock frequency to the PLL is 100 MHz, and the VCO is operating at 600 MHz after locking. Let the output divider be set to divide by 6. So the output frequency is also 100 MHz. Let us suppose that we want to introduce a phase shift of 45-degree with respect to the input clock. To do this the load bits to the phase generator are set as binary equivalent of decimal value 1 and then VCO output OT4 is selected. As a result, the phase generator counter will enable the output divider after one cycle of the VCO clock and half VCO cycle phase will come from the VCO TAP.

Thus, it is seen that if the phase shift is to be achieved for more than one cycle, the configuration bits of phase generators are programmed for the desired number. Once the same number of cycles lapse, the desired phase shift output is obtained. In case the phase shift is desired for less than a cycle, the required fraction is obtained from the multiplexer giving the desired fractional phase shift. Also in case fractional as well as N VCO cycles phase shift are desired, the two arrangements can be used simultaneously.

Figure 1:
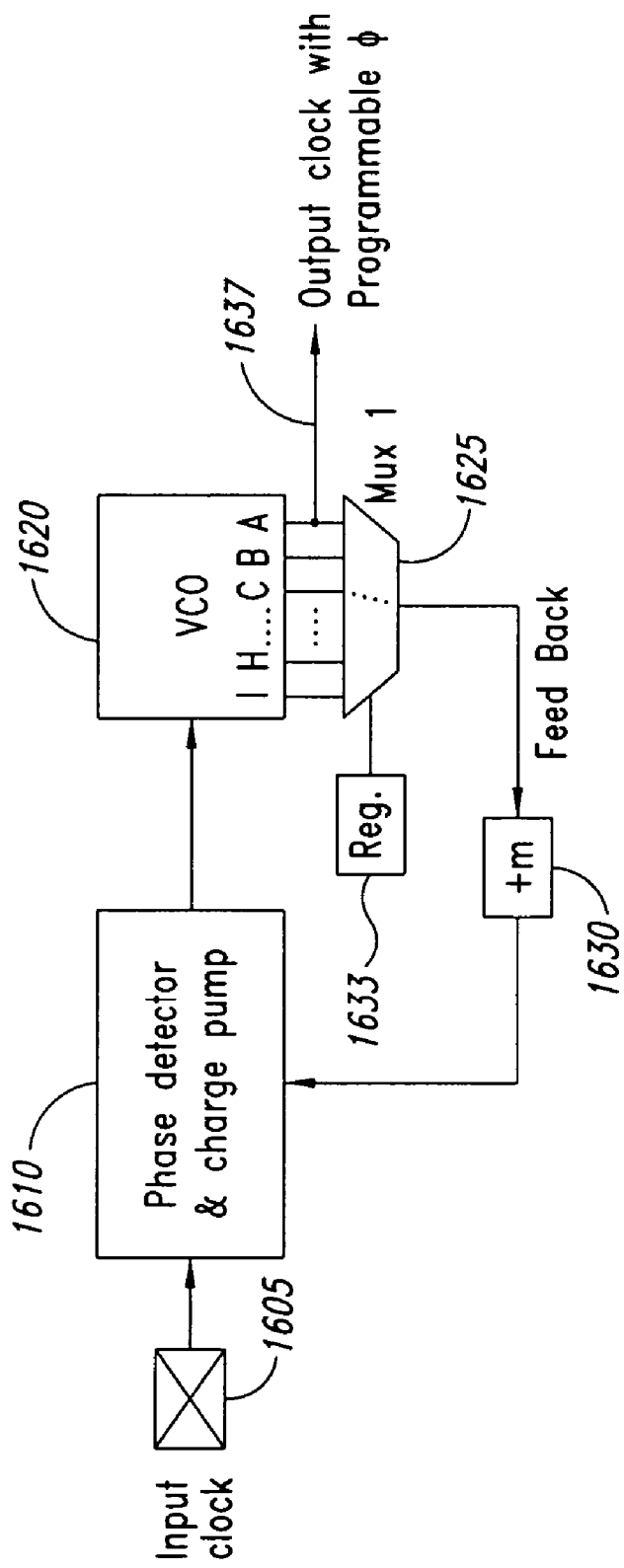
FIG. 1 illustrates a conventional phase shift generator.
Figure 2:
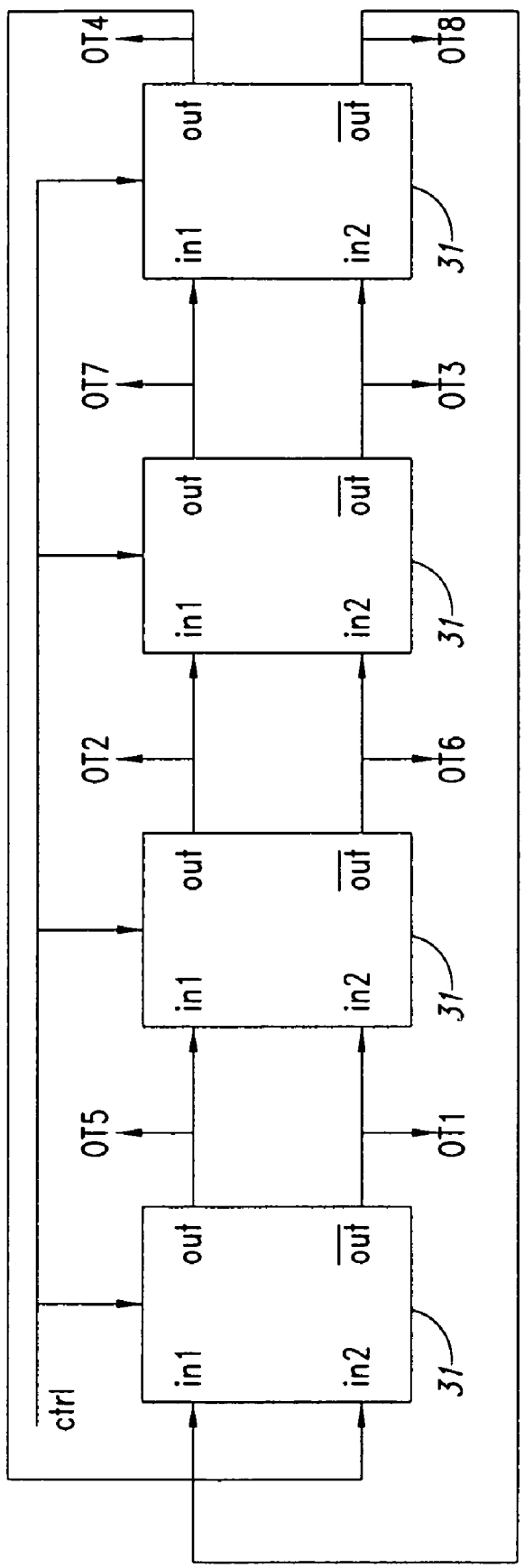
FIG. 2 illustrates the internal structure of the conventional multiphase voltage controlled oscillator.
Figure 3:
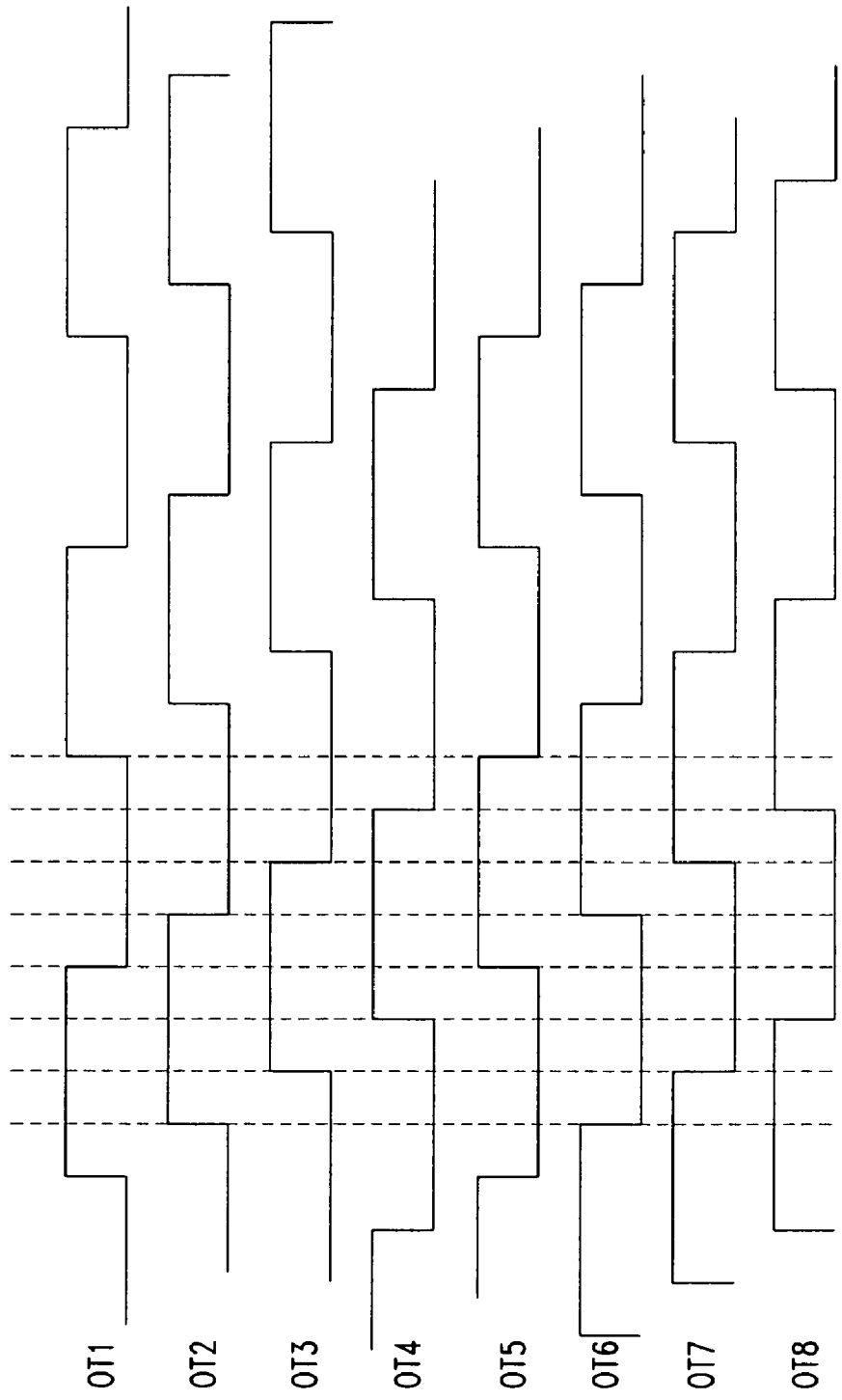
FIG. 3 illustrates the input output waveforms of the conventional multiphase voltage controlled oscillator.
Figure 6:
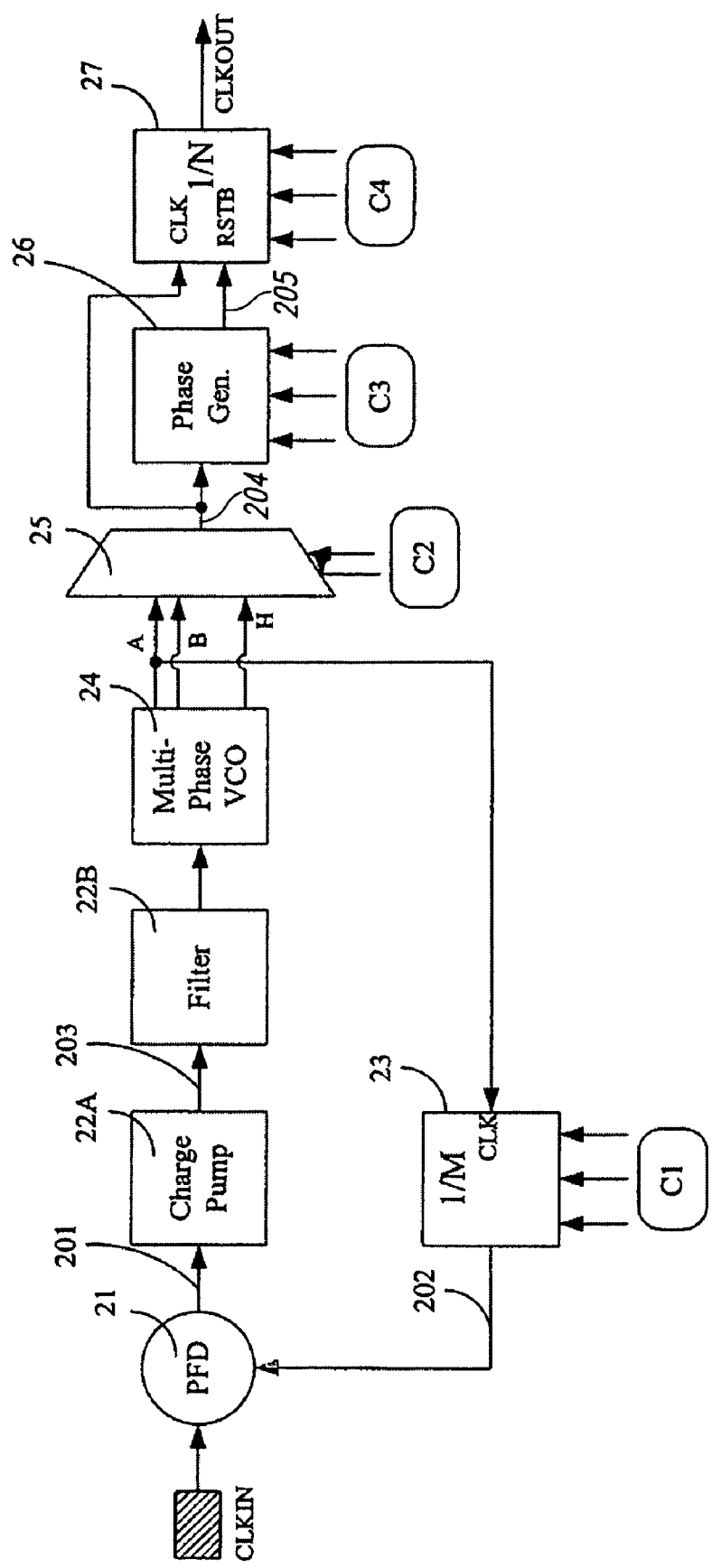
FIG. 6 illustrates a phase locked loop where the phase shift is introduced by said phase generator of FIG. 4.

FIG. 6 shows a phase-locked loop that performs frequency and phase synthesis. The input clock is connected to one terminal of phase-frequency detector (PFD) 21. Feedback clock 202 is connected to the other input of PFD. The error signals in terms of outputs of PFD (UP & DN) 201 are connected to the input of a charge pump 22A. The output 203 of charge pump 22A is connected to a low pass filter 22B. The low pass filter output 203 is the control voltage of VCO 24. VCO 24 generates a clock whose frequency is dependent on the control voltage. As the control voltage changes, the frequency of the VCO also changes. This circuit employs a multi-phase VCO 24, which is shown in FIG. 2. The VCO generates multiple phases (A, B, . . . H) whose frequency is same but they are phase shifted with respect to each other.

The VCO output 'A' is connected to the input of programmable divider 23. The output of the divider is connected to the input of PFD 21. The divider 23 in the feedback is used get a frequency multiplication.

If 'A' were taken as the reference phase, then the other outputs would have phase difference with respect to 'A'. Let us take an example of 8-phase VCO. The outputs 'A' to 'H' are 45-degree phase shifted with respect to the consecutive one. So a phase shift of 0-degree to 360-degree can be obtained with respect to the input clock if the input clock is within the range of VCO frequency range, by selecting a tap (A to G) from multiplexer 25.

If a divider at the output of VCO is used, then one cannot get up to 360-degree phase shift with respect to the output clock frequency or the input clock if the frequency of the input clock is lower than the range supported by VCO.

To eliminate this limitation, phase generator 26 is used at the output of the multiplexer 25. This block is programmable. This introduces the phase shift in terms of VCO cycles. So the block can be programmed to provide one VCO cycle phase shift or any number of VCO cycles as per programming bits 'C3'

The output 205 of phase generator 26 is connected to the reset terminal of output divider 27 while the output 204 of the multiplexer 25 is directly connected to the clock input of the divider 27.

The basic principle is that the phase generator 26 keeps the output divider 27 reset for as many number of VCO cycles as the phase shift is required.

'C1, C2, C3 & C4' are the programming bits used to program the feedback divider 23, VCO multiplexer 25, phase generator '26, and output divider 27 respectively.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A phase generator for introducing phase shift in a signal, comprising:
   a phase-shift enable and disable signal generator having a configuration input connected to configuration bits, a reset input connected to a reset signal, and an output for generating a control signal; said configuration bits corresponding to the phase shift;
   a logic signal generation device having a control input connected to the output of said phase-shift enable and disable signal generator, a reset input connected to the reset signal, and an output for providing a phase generating signal; and
   a feedback element connected between the output of said logic signal generation device and a control input of said phase-shift enable and disable signal generator, the feedback element having an output providing a controlled clock signal to said phase-shift enable and disable signal generator.

2. A phase generator as claimed in claim 1, wherein said phase-shift enable and disable signal generator comprises:
   a counter having a first input connected to the configuration bits, a second input connected to the output of said feedback element, a reset input receiving said reset signal, and an output for generating a count sequence;
   a first logic element having an input connected to said count sequence and an output for generating a first enable or disable signal; and
   a second logic element having a first input connected to said first enable or disable signal, a second input connected to the output of said feedback element, and an output for generating a second enable or disable signal.

3. A phase generator as claimed in claim 2, wherein said counter is a down counter.

4. A phase generator as claimed in claim 1, wherein said logic signal generation device is a data flip flop having a data input connected to a higher voltage supply.

5. A phase generator as claimed in claim 1, wherein said feedback element comprises:
   a logic inverter; and
   a logic AND gate having a first input connected to the output of said logic inverter, a second input connected to a clock signal, and an output for generating said controlled clock signal.

6. A phase locked loop, comprising:
   a phase difference detector having a first input connected to an input signal, a second input connected to a reference signal, and an output, the phase difference detector being structured to detect a phase difference between the frequency of said input signal and the frequency of said reference signal;
   a regulator coupled to the output of said phase difference detector for regulating the detected phase difference;
   a filter connected at an output of said regulator to minimize spurious signals in said regulated phase difference;
   an oscillator connected to an output of said filter for generating at least two non-overlapping phase signals, said non-overlapping phase signals being phase shifted with respect to said input signal;

a selector connected to an output of said oscillator and structured to select one of the non-overlapping phase signals;

a phase generator coupled to an output of said selector for producing a configurable phase generating signal with a phase shift, the phase generator including:

a phase-shift enable and disable signal generator having a configuration input connected to configuration bits, a reset input connected to a reset signal, and an output for generating a control signal; said configuration bits corresponding to the phase shift;

a logic signal generation device having a control input connected to the output of said phase-shift enable and disable signal generator, a reset input connected to the reset signal, and an output for providing a phase generating signal; and a feedback element connected between the output of said logic signal generation device and a control input of said phase-shift enable and disable signal generator, the feedback element having an output providing a controlled clock signal to said phase-shift enable and disable signal generator; and a divider having a first input coupled to the output of said logic signal generation device of said phase generator, a second input coupled to the output of said selector, and a control input receiving configuration bits for incorporating additional phase shift of at least one cycle in the selected non-overlapping phase signal.

7. A phase locked loop as claimed in claim 6, wherein said regulator is a charge pump.

8. A phase locked loop as claimed in claim 6, wherein said filter is a low pass filter.

9. A phase locked loop as claimed in claim 6, wherein said oscillator is a multiphase voltage controlled oscillator.

10. A phase locked loop as claimed in claim 6, wherein said selector is an eight input multiplexer.

11. A method of introducing phase shift in a signal, comprising:

applying a reset signal to a phase enable and disable signal generator for enabling configuration bits corresponding to the phase shift;

controlling, based on a control signal output by the phase enable and disable signal generator, a logic signal generation device for producing a phase generating signal; and feeding back an output of said logic signal generation device through a feedback element to provide a controlled clock signal to said phase enable and disable signal generator to thereby enable controlled phase shift incorporation in said signal, wherein said applying step includes:

loading a down counter with the configuration bits corresponding to the phase shift;

generating a down count sequence from a value of the configuration bits to zero;

combining said down count sequence for producing a first enable or disable signal; and combining said first enable or disable signal and the output of said feedback element for generating a second enable or disable signal.

12. The method of claim 11, wherein said feeding back step includes:

logically inverting the output of said logic signal generation device;

combining said inverted output with an external clock signal; and connecting the combined output to said phase enable and disable signal generator.

13. The method of claim 12, wherein said controlling step includes:

applying the reset signal to said logic signal generation device;

applying the control signal at a control input of said logic signal generation device; and connecting a data input of said logic generation device to a higher voltage supply.

14. A method of introducing phase shift in a signal, comprising:

applying a reset signal to a phase enable and disable signal generator for enabling configuration bits corresponding to the phase shift;

controlling, based on a control signal output by the phase enable and disable signal generator, a logic signal generation device for producing a phase generating signal; and feeding back an output of said logic signal generation device through a feedback element to provide a controlled clock signal to said phase enable and disable signal generator to thereby enable controlled phase shift incorporation in said signal, wherein said controlling step includes:

applying the reset signal to said logic signal generation device;

applying the control signal at a control input of said logic signal generation device; and connecting a data input of said logic generation device to a higher voltage supply.

15. The method of claim 14, wherein said applying step includes:

loading a down counter with the configuration bits corresponding to the phase shift;

generating a down count sequence from a value of the configuration bits to zero;

combining said down count sequence for producing a first enable or disable signal; and combining said first enable or disable signal and the output of said feedback element for generating a second enable or disable signal.

16. A method of introducing phase shift in a signal, comprising:

applying a reset signal to a phase enable and disable signal generator for enabling configuration bits corresponding to the phase shift;

controlling, based on a control signal output by the phase enable and disable signal generator, a logic signal generation device for producing a phase generating signal; and feeding back an output of said logic signal generation device through a feedback element to provide a controlled clock signal to said phase enable and disable signal generator to thereby enable controlled phase shift incorporation in said signal, wherein said feeding back step includes:

logically inverting the output of said logic signal generation device;

combining said inverted output with an external clock signal; and connecting the combined output to said phase enable and disable signal generator.

17. The method of claim 16, wherein said controlling step includes:

applying the reset signal to said logic signal generation device;

applying the control signal at a control input of said logic signal generation device; and connecting a data input of said logic generation device to a higher voltage supply.

18. A phase locked loop, comprising:

a phase difference detector having a first input connected to an input signal, a second input connected to a reference signal, and an output, the phase difference detector being structured to detect a phase difference between a frequency of said input signal and a frequency of said reference signal;

an oscillator having an input, coupled to the output of said phase difference detector, and a first output, the oscillator being configured to generate at the first output a first phase signal that is phase shifted with respect to said input signal;

a phase generator coupled to the first output of said oscillator and configured to produce a configurable phase generating signal with a phase shift, the phase generator including:

a phase-shift enable and disable signal generator having a configuration input connected to configuration bits, a reset input connected to a reset signal, and an output for generating a control signal; said configuration bits corresponding to the phase shift;

a logic signal generation device having a control input connected to the output of said phase-shift enable and disable signal generator, a reset input connected to the reset signal, and an output for providing a phase generating signal; and a feedback element connected between the output of said logic signal generation device and a control input of said phase-shift enable and disable signal generator, the feedback element having an output providing a controlled clock signal to said phase-shift enable and disable signal generator.

19. The phase locked loop of claim 18, further comprising a regulator coupled between the output of said phase difference detector and the input of the oscillator and configured to regulate the detected phase difference, wherein said regulator includes a charge pump.

20. The phase locked loop of claim 18, further comprising a filter coupled between the output of said phase difference detector to minimize spurious signals in said detected phase difference.

21. The phase locked loop of claim 18, wherein said oscillator is a multiphase voltage controlled oscillator having a second output and configured to generate at the second output a second phase signal that is phase shifted with respect to said input signal and is non-overlapping with respect to the first phase signal.

22. The phase locked loop of claim 21, further comprising a selector connected to the outputs of said oscillator and structured to select either one of the first and second phase signals.

23. The phase locked loop of claim 22, wherein said selector is an eight input multiplexer.

24. The phase locked loop of claim 22, further comprising a divider having a first input coupled to the first output of said logic signal generation device of said phase generator, a second input coupled to an output of said selector, and a control input receiving configuration bits for incorporating additional phase shift of at least one cycle in the selected phase signal.

* * * * *

UNITED STATES PATENT AND TRADEMARK OFFICE
CERTIFICATE OF CORRECTION

PATENT NO.       : 7,656,987 B2                                              Page 1 of 1
APPLICATION NO.  : 11/324199
DATED            : February 2, 2010
INVENTOR(S)      : Puneet Sareen It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 958 days.

Signed and Sealed this

Thirtieth Day of November, 2010

David J. Kappos
*Director of the United States Patent and Trademark Office*